United States Patent [19]
Reinten

[11] Patent Number: 6,144,396
[45] Date of Patent: Nov. 7, 2000

[54] EXPOSURE DEVICE AND PRINTER

[75] Inventor: Hans Reinten, Velden, Netherlands

[73] Assignee: Océ–Nederland, B.V., Venlo, Netherlands

[21] Appl. No.: 08/683,119

[22] Filed: Jul. 16, 1996

Related U.S. Application Data

[63] Continuation of application No. 07/957,818, Oct. 8, 1992, abandoned.

[30] Foreign Application Priority Data

Oct. 18, 1991 [NL] Netherlands ............................. 9101745

[51] Int. Cl.⁷ ................................. B41J 2/45; H01L 33/00
[52] U.S. Cl. ................................................ 347/238; 257/91
[58] Field of Search ..................... 347/238, 130; 257/88, 91

[56] References Cited

U.S. PATENT DOCUMENTS

| | | | |
|---|---|---|---|
| 4,259,679 | 3/1981 | Knibb et al. ............................ 257/98 |
| 4,536,778 | 8/1985 | De Schamphelaere et al. ........ 347/130 |
| 4,605,944 | 8/1986 | Ishii et al. ................................ 257/91 |
| 4,721,977 | 1/1988 | Fukae ................................. 347/238 X |
| 4,951,098 | 8/1990 | Albergo et al. .................... 347/238 X |
| 4,956,684 | 9/1990 | Urata .................................. 347/238 X |
| 4,984,035 | 1/1991 | Kanzawa et al. ........................ 257/93 |
| 5,337,074 | 8/1994 | Thornton ................................ 347/237 |

FOREIGN PATENT DOCUMENTS 2-248255   10/1990   Japan .............................. B41J 2/255

*Primary Examiner*—David F. Yockey

[57] ABSTRACT

An exposure device comprising a straight row of substantially rectangular LED's, each LED comprising at least one non-emitting zone (34) having a width (a) which divides the LED into at least two equal parts (32, 33) having a width (c), a separating zone (35) of width (b) being situated between each of the LED's and the width (a) of the non-emitting zone (34) being smaller than 1.5 times the width (b) of a separating zone (35) and larger than 0.75 times the width (b) of the separating zone (35).

14 Claims, 3 Drawing Sheets

EXPOSURE DEVICE AND PRINTER

This application is a continuation of application Ser. No. 07/957,818 filed on Oct. 8, 1992, now abandoned.

BACKGROUND OF THE INVENTION

1. Field of the Invention

The invention relates to an exposure device for a imaging system, and more specifically to an exposure device comprising a straight row of substantially rectangular light-emitting elements LEDs, and a printer provided with such a straight row of LEDs.

2. Description of the Related Art

Exposure devices and printers of this kind are known from European patent specification 0 097 261, in which image formation is effected by means of a number of LEDs disposed in a straight row, these LEDs being imaged on a moving photoconductor via a Selfoc array. In order to increase the light yield, the LEDs are constructed in the form of elongated rectangles or parallelograms. The elongated LEDs are imaged as squares or diamonds by disposing a cylindrical lens between the row of LEDs and the photoconductor.

One disadvantage of these known devices is that the light distribution on the photosensitive medium is not uniform as considered in the direction of the row, there being a zone where there is distinctly less light formed between two image dots. In order that the photoconductor may nevertheless be fully exposed at these locations, it is necessary to increase the total light level, e.g. by increasing the LED energization current, as a result of which the heat evolution and the life of the LEDs decreases. Moreover, thin lines to be imaged will be completely over-exposed at the places where an increased amount of light falls, and thus these are no longer reproduced.

SUMMARY OF THE INVENTION

Therefore, it is an object of the present invention to provide an exposure system which will overcome the above noted disadvantages.

It is a further object of the present invention to provide a novel array of light-emitting elements for exposing a moving photoconductor.

The foregoing objects and others are accomplished in accordance with the present invention, generally speaking, by providing an exposure device comprising a straight row of substantially rectangular light-emitting elements wherein the width (a) of a non-emitting zone is smaller than 1.5 times the width (b) of a separating zone and larger than 0.75 times the width (b) of the separating zone. As a result, the uniformity of exposure as considered in the direction of the straight row increases, so that the exposure tolerance increases.

BRIEF DESCRIPTION OF THE DRAWINGS

These and other advantages will be explained in the following description with reference to drawings wherein:

FIG. 2b shows the light distribution of the row of LEDs of FIG. 2a,

DETAILED DESCRIPTION OF THE INVENTION

Figure 1:
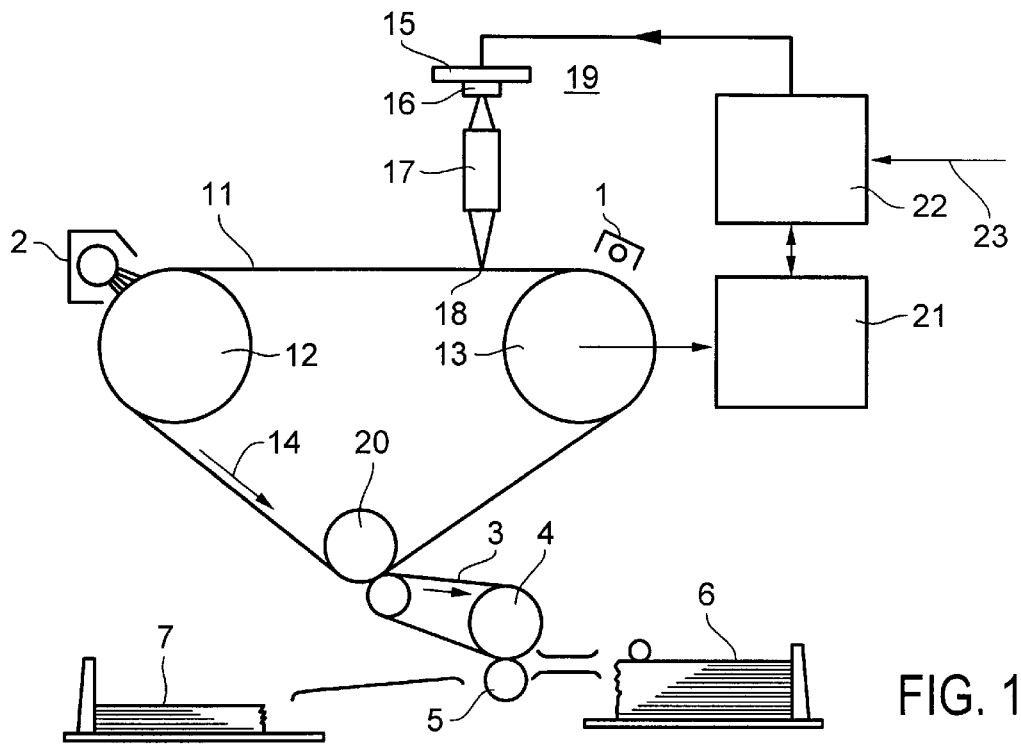
FIG. 1 diagrammatically illustrates a printer using a linear row of LEDs.

FIG. 1 is a diagrammatic illustration of a printer in which an electrophotographic belt 11 is passed about three rollers 12, 13 and 20 in the direction of arrow 14 (auxiliary scanning direction). A belt of this kind, for example, provided with a zinc oxide layer or an organic photosensitive layer, is charged in a known manner by means of a charging unit 1 and then exposed image-wise. Those places which have not received light are developed with toner powder by means of a developing device 2. The resulting powder image is transferred in a known manner to a heated silicone rubber belt 3. A sheet of receiving material is passed from a sheet tray 6 between rollers 4 and 5, and the powder image is transferred from the silicone rubber belt 3 to the receiving sheet on which it is fused. The resulting print is deposited in a collecting tray 7. An exposure device 19 comprises a carrier 15 with a row of LEDs extending perpendicularly to the direction of advance of the belt 11 and mounted above the belt 11. An array of imaging glass fibers is mounted between the exposure device 19 and the belt 11 and images each LED with an imaging ratio of 1:1 on the electrophotographic belt 11 (point 18). An image signal is fed via line 23 to an energizing device 22. A pulse disc is disposed on the shaft of roller 13 and delivers a signal in proportion to the movement of belt 11. This signal is fed to a synchronization device 21 in which a synchronization signal is generated. The image signals are fed to the exposure device 19 in response to the synchronization signal so that the electrophotographic belt 11 is exposed line by line image-wise, so that a row of image dots is formed on the belt 11.

Figure 2A:
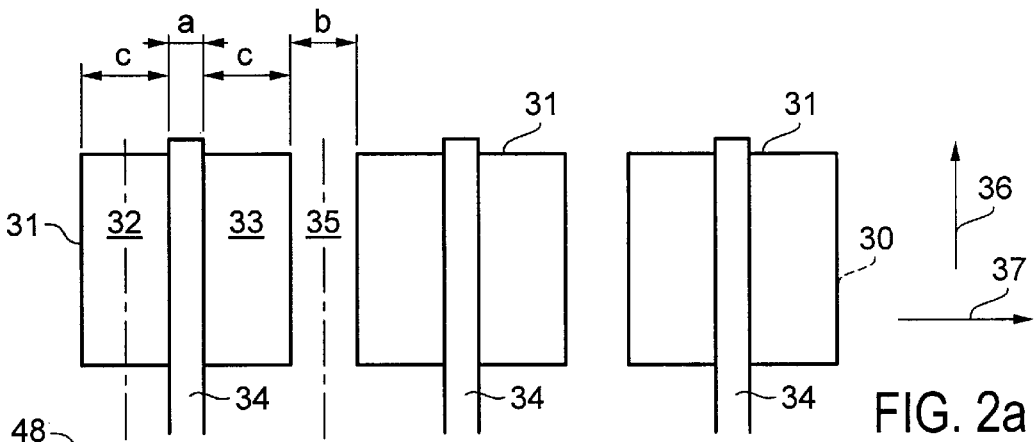
FIG. 2a is a linear row of LEDs according to the prior art.
Figure 2B:
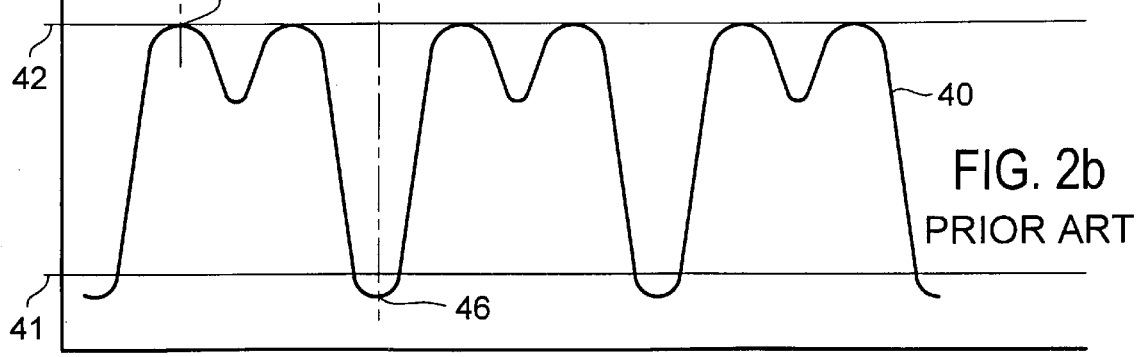

FIG. 2a is a diagrammatic top plan view of an exposure device as known from the prior art and comprises a straight row 30 of LEDs, each LED 31 being provided with a connecting electrode 34 extending in a direction 36 perpendicular to the row of LEDs and having a width (a) of 5 $\mu$m which divides the LED 31 into two equal parts 32, 33 each having a width (c) of 20 $\mu$m. Separating zones 35 of a width (b) of 15 $\mu$m, each time being formed between neighboring LEDs 31, are non-light emitting. If a photoconductive layer is advanced in a printer in a direction 36 past the row of LEDs, in order to expose this layer image-wise, the resulting light distribution in a plane through the main scanning direction and perpendicular to the plane of the drawing is as shown in FIG. 2b. In this, the x-axis is shown on the same scale as that of the row of LEDs in FIG. 2a. Thus, point 47 of the light distribution curve 40 in FIG. 2b indicates the quantity of light received by a point on the photosensitive medium if such point is moved in the auxiliary scanning direction 36 over the broken line 48 along the row of LEDs in FIG. 2a. Similarly, the quantity of light received by a point on the photosensitive medium moving past the row of LEDs along the line 49 is denoted by point 46 in the light distribution curve 40.

The light distribution curve 40 has a maximum ($L_{max}$) in zones straight above the LEDs and a minimum ($L_{min}$) in the zones 35 between the LEDs. Since a given quantity of light is required to expose the photosensitive medium, $L_{min}$ will have to be at least such as to satisfy this given quantity.

Line 41 denotes the minimum exposure quantity required for correct exposure of the photoconductive layer. Line 42 indicates the maximum permissible exposure quantity which the photoconductive layer may reach in those zones which, on movement in the direction of arrow 36, are taken past the light-emitting zones 32, 33. If the exposure quantity in a zone is higher than indicated by line 42, then thin lines to be imaged will no longer be reproduced. The lowest points of curve 40 should be at least above line 41 to allow complete exposure to the photoconductive layer. In FIG. 2b this would mean that the total light output has to be increased, so that parts of the curve 40 will be above line 42 and thin lines attacked.

Figure 3A:
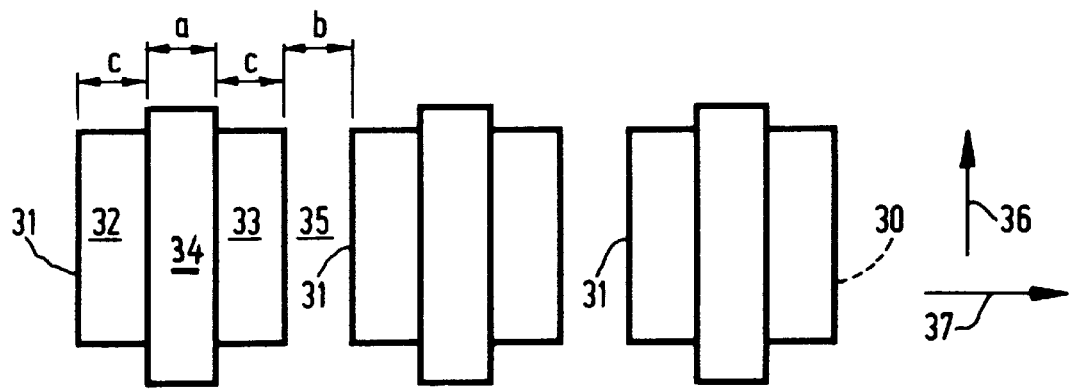
FIG. 3a shows a linear row of LEDs according to the invention.
Figure 3B:
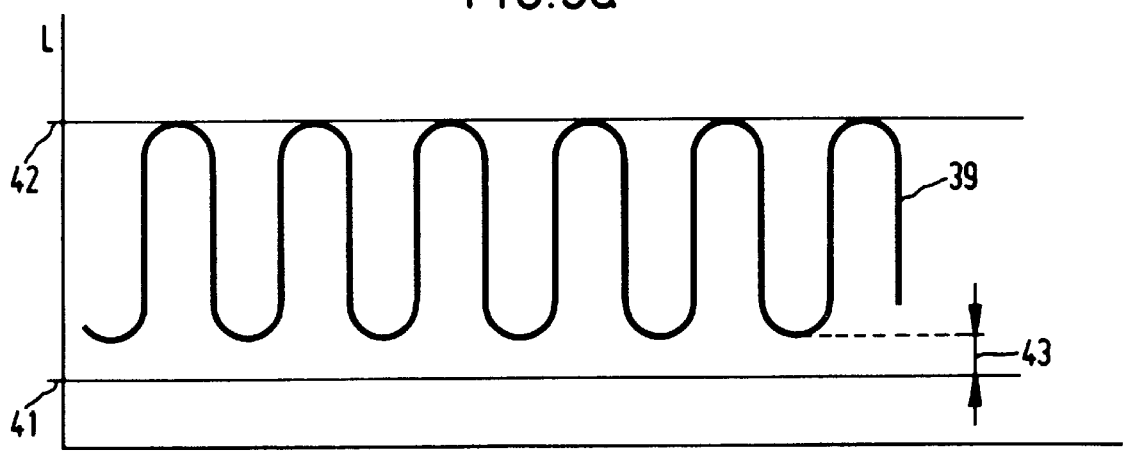
FIG. 3b shows the associated light distribution.

FIG. 3a is a diagram showing an exposure device according to the invention. The reference numerals in this Figure are the same as those in FIG. 2a. Here the connecting electrode 34 has a width (a) of 15 μm of the separating zone 35. The width of zone (c) is also 15 μm. The consequence of this is a frequency doubling of non-emitting zones 34, and 35, so that a more uniform light distribution forms at some distance from the LEDs, and hence on the photoconductor. This is indicated by curve 39 in FIG. 3b. FIG. 3b is shown to the same scale as FIG. 2b and standardized to the maximum exposure just touching line 42. The bottom edge of the curve 39 is now situated a light quantity 43 above the background illumination limit 41. This means that the exposure tolerance has increased. For example, it is possible to reduce the light quantity of all the LEDs to such an extent that the bottom edge of curve 39 just touches line 41. The top edge of curve 39 consequently will be lower than line 42, so that even thinner lines to be reproduced can be reproduced without difficulty.

It has now been found that a satisfactory improvement in exposure uniformity occurs if $1.5 > a/b > 0.75$, the optimum being that geometry where $a = b$.

According to the invention, however, it is also possible to cover the zone of the connecting electrode 34 with a varnish which does not transmit light so that no light can emerge at that place. The only factor of importance for uniformity improvement is the substantially equal width of the non-emitting zones 34 and 35.

Figure 4:
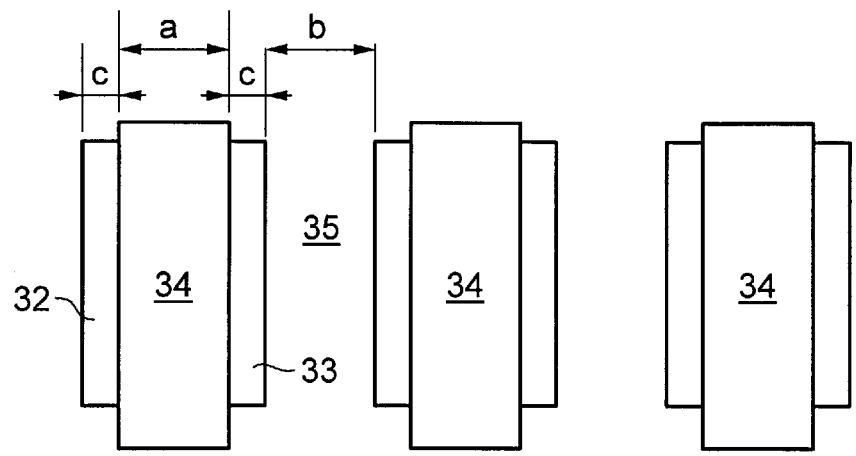
FIG. 4 is another embodiment of a linear row of LEDs according to the invention.

In FIG. 4, the principle as explained with reference to FIG. 3a–3b is applied differently. The zones 34 (connecting electrode) and 35 (separating zone) are again substantially of equal width ($a = b$), but now the zones (c) LEDs are much narrower ($c \approx z \frac{1}{3}a$). This configuration also gives a satisfactory uniformity improvement.

Figure 5:
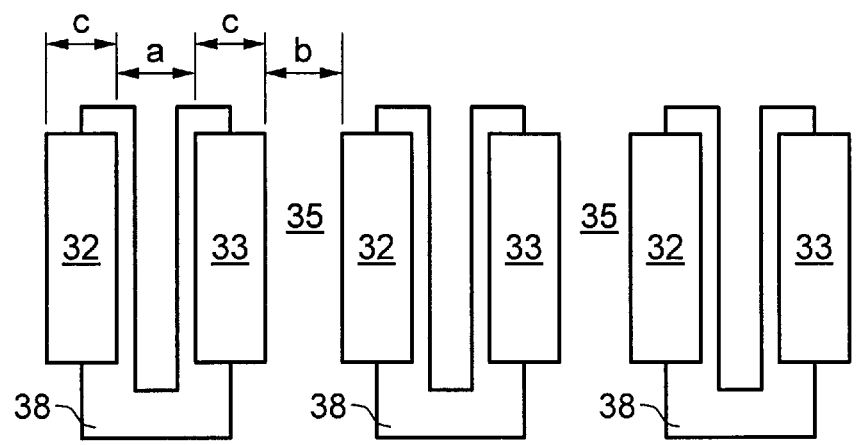
FIG. 5 is another embodiment of a linear row of LEDs according-to-the invention.

FIG. 5 shows an exposure device according to the invention in which each LED has two separate light-emitting surfaces 32, 33 which can be energized simultaneously via a connecting electrode 38. Here again $a = b$ and $a = c$.

Figure 6:
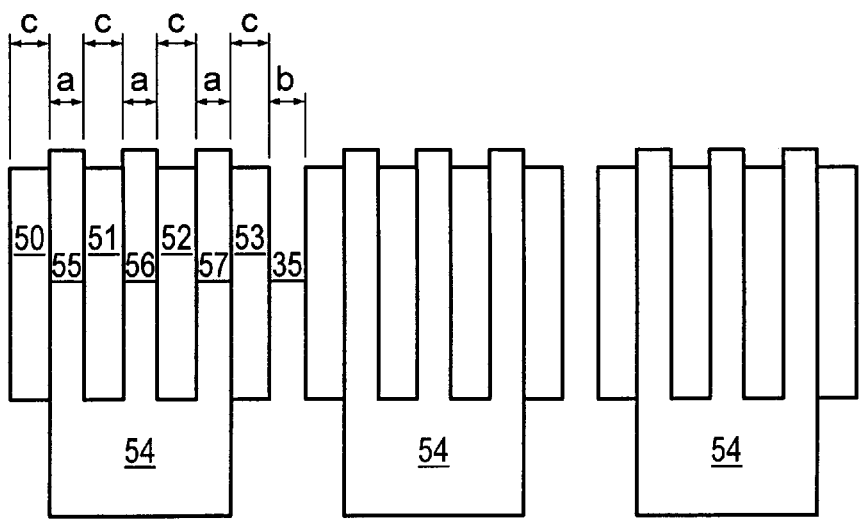
FIG. 6 is another embodiment of a linear row of LEDs according to the invention.

FIG. 6 shows an exposure device according to the invention in which each LED is divided by connecting electrode 54 into four light-emitting zones 50, 51, 52 and 53. Here again the zones 55, 56 and 57 have the same width (a) as the separating zone 35.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An exposure device of relatively lower light emitting area density, the device comprising:

a straight row of pairs of equally-sized rectangular light emitting areas;

said equally-sized rectangular light emitting areas of each pair being separated by an energizing electrode of a first width, a;

each two adjacent said pairs being separated by a second width, b, such that said first width, a, and said second width, b, have a first relation, $0.75b < a < 1.5b$; and each said equally-sized rectangular light emitting areas being of a third width, c, such that said third width, c, is approximately equal to a/3.

2. A printer of relatively lower light emitting area density, the printer comprising:

a straight row of pairs of equally-sized rectangular light emitting areas;

a photosensitive element which can be moved past said straight row of said pairs;

said equally-sized rectangular light emitting areas of each pair being separated by an energizing electrode of a first width, a;

each two adjacent said pairs being separated by a second width, b, such that said first width, a, and said second width, b, have a first relation, $0.75b < a < 1.5b$; and each said equally-sized rectangular light emitting areas being of a third width, c, such that said third width, c, is approximately equal to a/3.

3. An exposure device of relatively lower light emitting area density, the device comprising:

a straight row of pairs of equally-sized rectangular light emitting areas;

said equally-sized rectangular light emitting areas of each pair being separated by an energizing electrode of a first width, a;

each two adjacent said pairs being separated by a second width, b, such that said first width, a, and said second width, b, have a first relation, $0.75b < a < 1.5b$;

each said equally-sized rectangular light emitting areas being of a third width, c, such that said third width, c, and said first width, a, have a second relation $a/3 < c < a$; and said first and second relations resulting in a light output profile for which all peaks exhibit a first magnitude and all troughs exhibit a second magnitude less than said first magnitude.

4. An exposure device according to claim 3, wherein said first width, a, is approximately equal to said second width, b.

5. An exposure device according to claim 4, wherein said first width, a, is equal to said second width, b.

6. An exposure device according to claim 3, wherein said third width, c, is equal to said first width, a, and said second width, b.

7. An exposure device according to claim 3, further comprising an opaque coating on each said energizing electrode.

8. An exposure device according to claim 3, wherein each of said pairs of equally-sized rectangular light emitting areas is formed from a single light emitting diode (LED) on which is overlaid one of said energizing electrodes.

9. An exposure device according to claim 3, further comprising an opaque coating on each said energizing electrode.

10. An exposure device according to claim 3, wherein each of said pairs of equally-sized rectangular light emitting areas is formed from a single light emitting diode (LED) on which is overlaid one of said energizing electrodes.

11. A printer of relatively lower light emitting area density, the printer comprising:

a straight row of pairs of equally-sized rectangular light emitting areas;

a photosensitive element which can be moved past said straight row of said pairs;

said equally-sized rectangular light emitting areas of each pair being separated by an energizing electrode of a first width, a;

each two adjacent said pairs being separated by a second width, b, such that said first width, a, and said second width, b, have a first relation, $0.75b < a < 1.5b$; and each said equally-sized rectangular light emitting areas being of a third width, c, such that said third width, c, and said first width, a, have a second relation, $a/3 \leq c \leq a$; and said first and second relations resulting in a light output profile of said exposure device for which all peaks exhibit a first magnitude and all troughs exhibit a second magnitude less than said first magnitude.

12. A printer according to claim 11, wherein said first width, a, is approximately equal to said second width, b.

13. A printer device according to claim 12, wherein said first width, a, is equal to said second width, b.

14. A printer according to claim 11, wherein said third width, c, is equal to said first width, a, and said second width, b.

* * * * *